(12) United States Patent  
Nagatomo

(10) Patent No.: US 6,335,646 B1
(45) Date of Patent: Jan. 1, 2002

(54) POWER-ON RESET CIRCUIT FOR GENERATING A RESET PULSE SIGNAL UPON DETECTION OF A POWER SUPPLY VOLTAGE

(75) Inventor: Shigeru Nagatomo, Miyazaki pref. (JP)

(73) Assignee: Oki Electric Industry Co., Ltd., Tokyo (JP)

( * ) Notice: Subject to any disclaimer, the term of this patent is extended or adjusted under 35 U.S.C. 154(b) by 0 days.

(21) Appl. No.: 09/552,315

(22) Filed: Apr. 19, 2000

(30) Foreign Application Priority Data

Apr. 28, 1999 (JP) ............................................. 11-123131

(51) Int. Cl.[7] .............................................. H03K 17/22
(52) U.S. Cl. ........................................ 327/143; 327/198
(58) Field of Search ................................... 327/143, 198

(56) References Cited

U.S. PATENT DOCUMENTS

| | | | | |
|---|---|---|---|---|
| 4,551,841 A | * | 11/1985 | Fujita et al. ................. | 327/143 |
| 4,581,552 A | * | 4/1986 | Womack et al. ............ | 327/143 |
| 4,812,679 A | * | 3/1989 | Mahabadi .................... | 327/143 |
| 4,970,408 A | * | 11/1990 | Hanke et al. ................ | 327/143 |
| 4,985,641 A | * | 1/1991 | Nagayama et al. ......... | 327/143 |
| 5,180,926 A | * | 1/1993 | Skripek ....................... | 327/143 |
| 5,847,586 A | * | 12/1998 | Burstein et al. ............ | 327/143 |
| 6,121,803 A | * | 9/2000 | Tanaka ........................ | 327/143 |
| 6,204,701 B1 | * | 3/2001 | Tsay et al. .................. | 327/143 |

FOREIGN PATENT DOCUMENTS

JP 58-80928 5/1983 .......... H03K/17/22

* cited by examiner

Primary Examiner—Terry D. Cunningham
(74) Attorney, Agent, or Firm—Juichi Mimura

(57) ABSTRACT

A power-on reset circuit includes a capacitor, an inverter, a resistor and first and second transistors which are connected in series between a power supply line and ground. The electric current flowing through the resistor flow through the first and second transistors with a certain time delay because of an electric charge stored in the capacitor. A rising of a power supply voltage is applied to the inverter with a certain time delay when the power supply voltage goes up. According to the power-on reset circuit, a reset pulse can be generated regardless a speed of rising of the power supply voltage.

12 Claims, 7 Drawing Sheets

US 6,335,646 B1

POWER-ON RESET CIRCUIT FOR GENERATING A RESET PULSE SIGNAL UPON DETECTION OF A POWER SUPPLY VOLTAGE

CROSS-REFERENCE TO RELATED APPLICATION

This application claims the priority benefit of Japanese Patent Application No. No. 11-123131, filed Apr. 28, 1999, the entire subject matter of which is incorporated herein of reference.

BACKGROUND OF THE INVENTION

1. Field of the invention

The invention relates to a power-on reset circuit, more particularly, to a circuit that outputs a pulse to reset an internal circuit of a semiconductor device upon detection that power supply has turned on.

2. Description of the Related Art

FIG. 2 shows a first power-on reset circuit in the related art. The first power-on circuit includes a resistor 1, a capacitor 2 and an inverter 3. One end of the resistor 1 is connected to a power supply line to which a power supply voltage Vdd is applied. The capacitor 2 is connected between the other end of the resistor 1 (a node N1) and ground. An input terminal of the inverter 3 is connected to the node N1.

FIG. 3 is a timing chart showing operational waveforms of the first power-on reset circuit shown in FIG. 2. The operations of the first power-on reset circuit is explained with reference to FIG. 3. When the power supply voltage Vdd is applied to the power supply line, an electric current flows through the resistor 1 so that the capacitor 2 is charged. When the power supply voltage Vdd goes up, the voltage at the node N1 goes up to Vdd with delay determined by a time constant which is decided by the resistor 1 and the capacitor 2. Since the inverter 3 is activated by the power supply voltage Vdd, a threshold voltage Vti of the inverter 3 goes up in proportion to the increase of the power supply voltage Vdd. As the voltage at the node N1 is lower than the threshold voltage Vti of the inverter 3 just after the power supply voltage Vdd is applied to the circuit, the inverter 3 outputs an H level signal having a voltage that goes up similar to the power supply voltage Vdd. At a time T1, the voltage of the node N1 exceeds the threshold voltage Vti of the inverter 3, and the inverter outputs an L level signal. According to the operation mentioned above, the inverter 3 outputs a signal as a reset pulse signal P. The reset pulse signal P is applied to reset internal circuits of a semiconductor device.

FIG. 4 shows a second power-on reset circuit in the related art. The second power-on circuit includes a resistor 4, an NMOS transistor 5, a first inverter 6 and a second inverter 7. One end of the resistor 4 is connected to a power supply line to which a power supply voltage Vdd is applied. The NMOS transistor 5 includes a source which is connected to ground, a drain which is connected to the other end of the resistor 4 (a node N2), and a gate which is connected to the power supply line. An output terminal of the first inverter 6 is connected to an input terminal of the second inverter 7. An input terminal of the first inverter 6 is connected to the node N2.

FIG. 5 is a timing chart showing operational waveforms of the second power-on reset circuit shown in FIG. 4. The operations of the second power-on reset circuit is explained with reference to FIG. 5. When the power supply voltage Vdd is applied to the power supply line and the power supply voltage Vdd goes up, the voltage at the node N2 also goes up. At a time T2, the power supply voltage Vdd reaches to a threshold voltage Vtn of the NMOS transistor 5. At that time, the NMOS transistor turns on and the voltage at node N2 turns to go down. At a time T3, the voltage at node N2 is equal to a threshold voltage Vti of the first inverter 6. Therefore, the output signal of the first inverter 6 turns from a L level to an H level. That is, until the time T3, the first inverter 6 outputs the L level signal having ground level and the second inverter 7 outputs the H level signal having a voltage that goes up similar to the power supply voltage Vdd. After the time T3, the second inverter 7 outputs the L level signal and the first inverter 6 outputs the H level signal having a voltage that goes up similar to the power supply voltage Vdd. According to the operation mentioned above, the second inverter 7 outputs a signal as a reset pulse signal P. The reset pulse signal P is applied to reset internal circuits of a semiconductor device.

When the power supply voltage Vdd gradually goes up the voltage at the node N1 also goes up gradually. Specifically, when the voltage at the node N1 comes close to the threshold voltage of the inverter 3, the inverter 3 of the first power-on reset circuit may output the H level signal and L level signal repeatedly. As a result, the wave form of the reset pulse signal of the first power-on reset circuit may be unstable.

When the power supply voltage goes up rapidly, the NMOS transistor 5 of the second power-on reset circuit may turn on just after the power is applied to the circuit. Accordingly, the first inverter 6 may output the H level signal because the electric potential at the node N2 rapidly falls to the grand level, and the second inverter 7 may continuously output the L level signal. Thus, the reset pulse signal of the second power-on reset circuit may not be generated.

SUMMARY OF THE INVENTION

An objective of the invention is to provide a power-on reset circuit for outputting a stable reset pulse signal regardless of a rising speed of a power supply voltage. That is, the power-on reset circuit of the invention can output a reset pulse signal when the power supply goes up either gradually or rapidly.

The objective is achieved by a power-on reset circuit generating a reset pulse upon detection of a power supply voltage. The circuit comprises a resistor connected between a power supply line to which a first power supply potential is applied and a first node, a first transistor having a gate connected to the power supply line, a drain connected to a second node, and a source connected to a reference node to which a second power supply potential is applied, a second transistor having a gate connected to the power supply line, a drain connected to the first node, and a source connected to the second node, a capacitor connected between the second node and the power supply line or the reference node, and an inverter having an input terminal connected to the first node.

BRIEF DESCRIPTION OF THE DRAWINGS

The invention will be more particularly described with reference to the accompanying drawings in which.

DETAILED DESCRIPTION OF THE PREFERRED EMBODIMENTS

Figure 1:
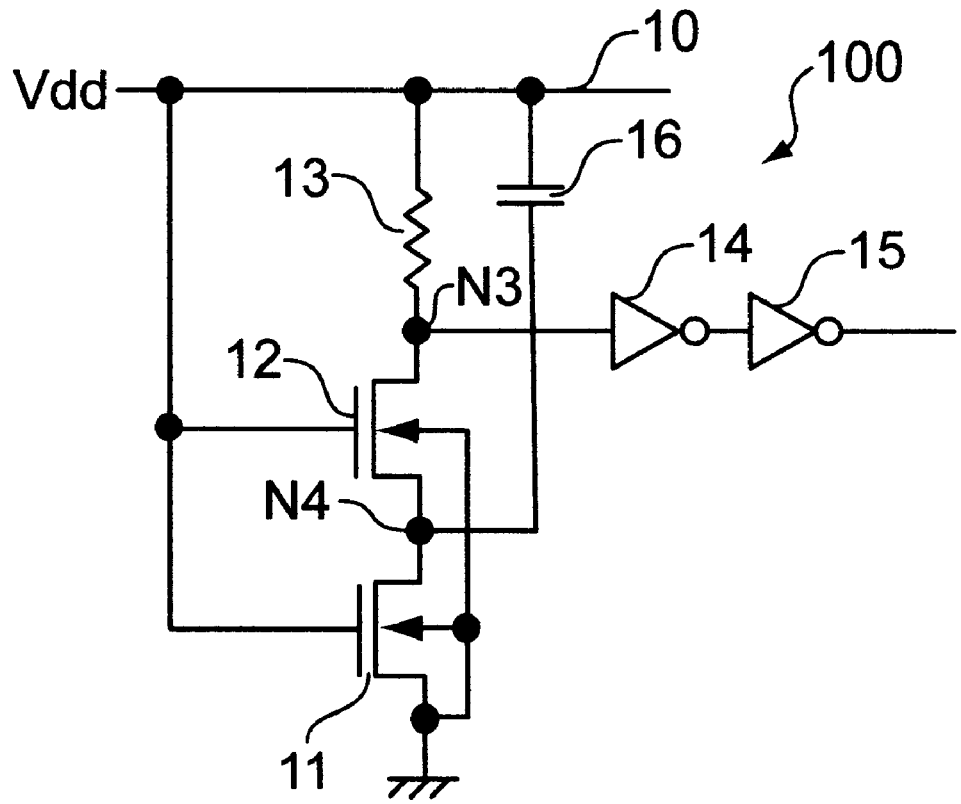
FIG. 1 is a circuit diagram of a power-on reset circuit according to a first embodiment of the invention.
Figure 2:
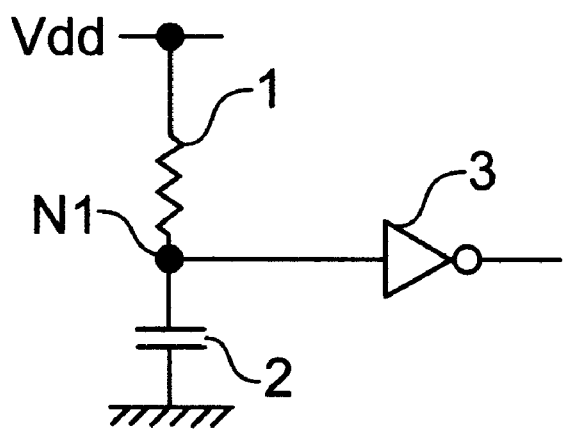
FIG. 2 is a circuit diagram of a first power-on reset circuit according to a related art.
Figure 3:
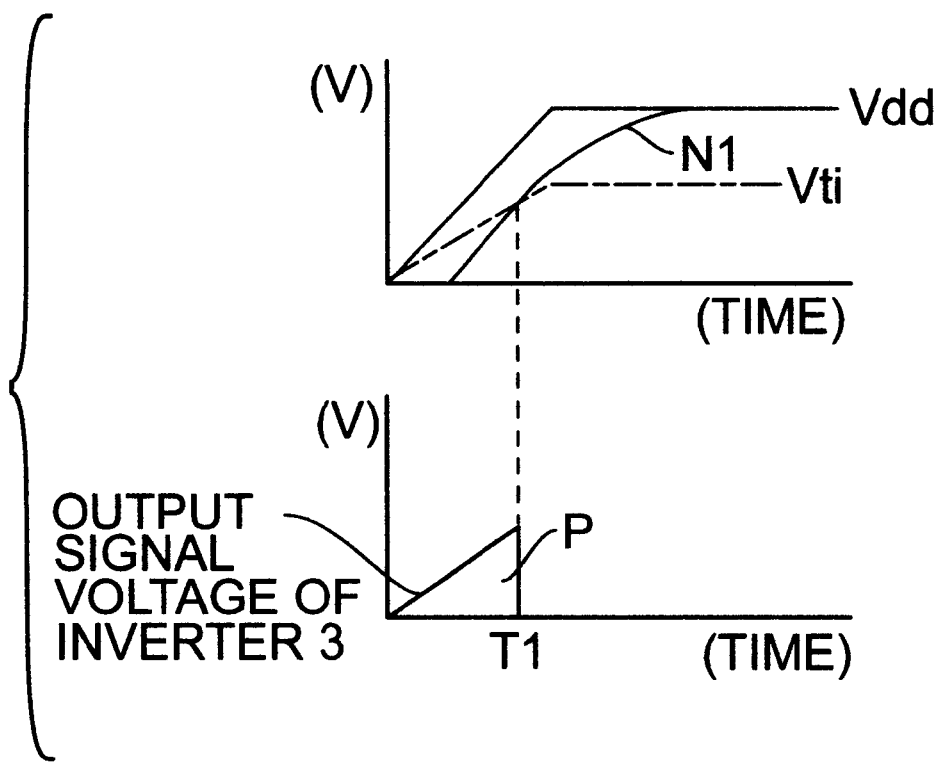
FIG. 3 shows waveforms for operating the power-on transistor shown in FIG. 2.
Figure 4:
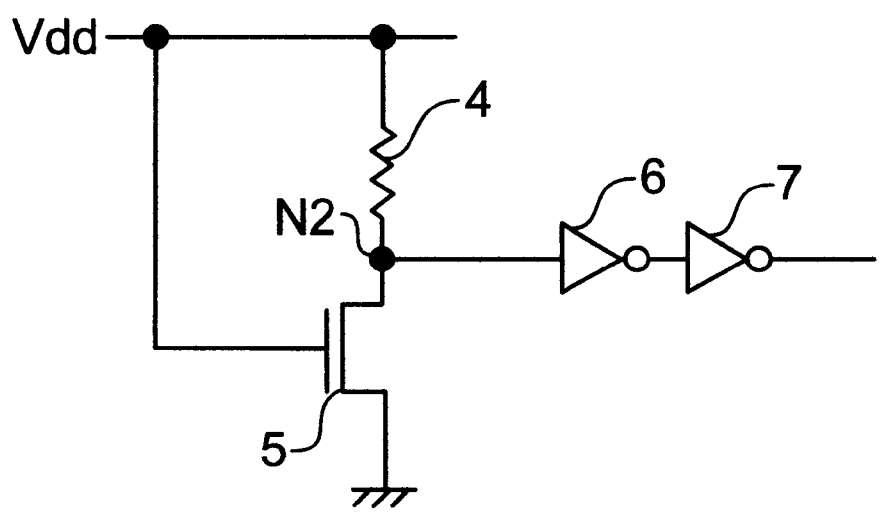
FIG. 4 is a circuit diagram of a second power-on reset circuit according to a related art.
Figure 5:
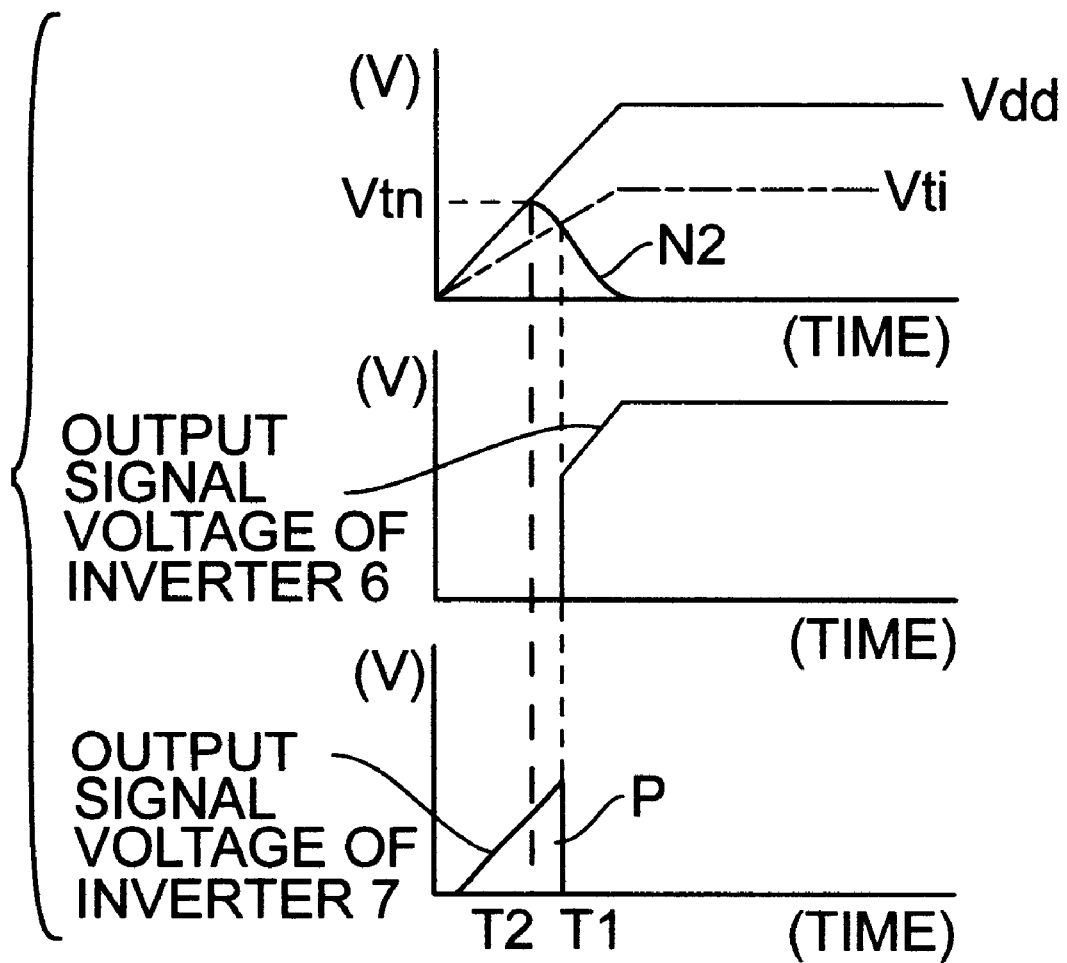
FIG. 5 shows waveforms for operating the power-on transistor shown in FIG. 4.

The first embodiment of the invention will be explained with reference to FIGS. 1, 6A and 6B. Referring to FIG. 1, a power-on reset circuit 100 of the first embodiment includes a first NMOS transistor 11, a second NMOS transistor 12, a resistor 13, a first inverter 14, a second inverter 15 and a capacitor 16. The power-on reset circuit 100 receives a power supply voltage Vdd from a power supply via a power supply line 10.

A gate of the first NMOS transistor 11 and a gate of the second NMOS transistor 12 are commonly connected to the line 10. A silicon substrate or a well formed on the silicon substrate on which the first and second NMOS transistors 11 and 12 are formed (back gates of the NMOS transistors 11 and 12), is connected to ground. A source of the first NMOS transistor 11 is connected to ground. A drain of the first NMOS transistor 11 is connected to a source of the second NMOS transistor 12 through a node N4. A drain of the second NMOS transistor 12 is connected to one end of the resistor 13 through a node N3. The other end of the resistor 13 is connected to the power supply line 10. An input terminal of the first inverter 14 is connected to the node N3. The input terminal of the second inverter 15 is connected to an output terminal of the first inverter 14. The capacitor 16 is connected between the power supply line 10 and the node N4.

Figure 6A:
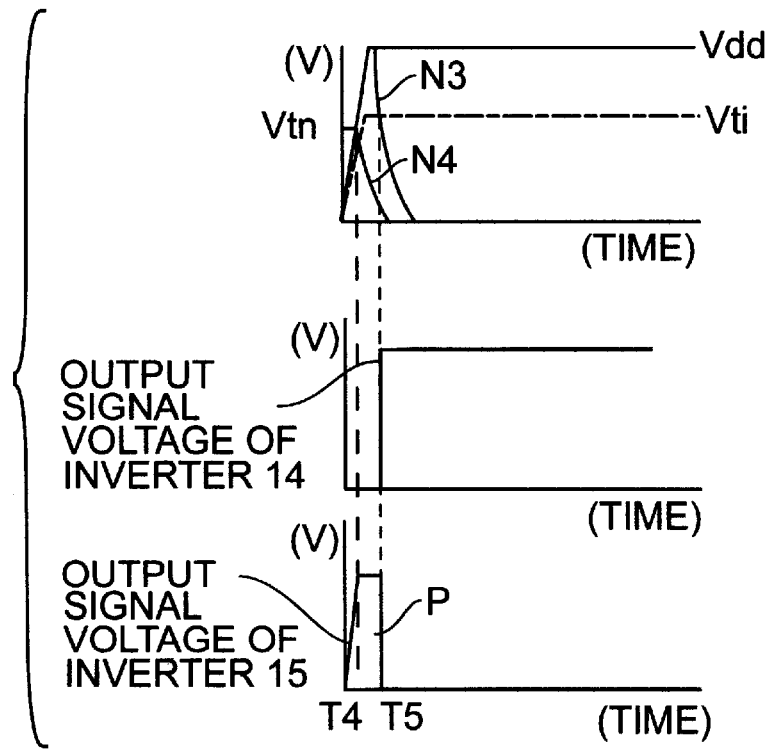
FIGS. 6A and 6B show waveforms for operating the power-on transistor shown in FIG. 1.
Figure 6B:
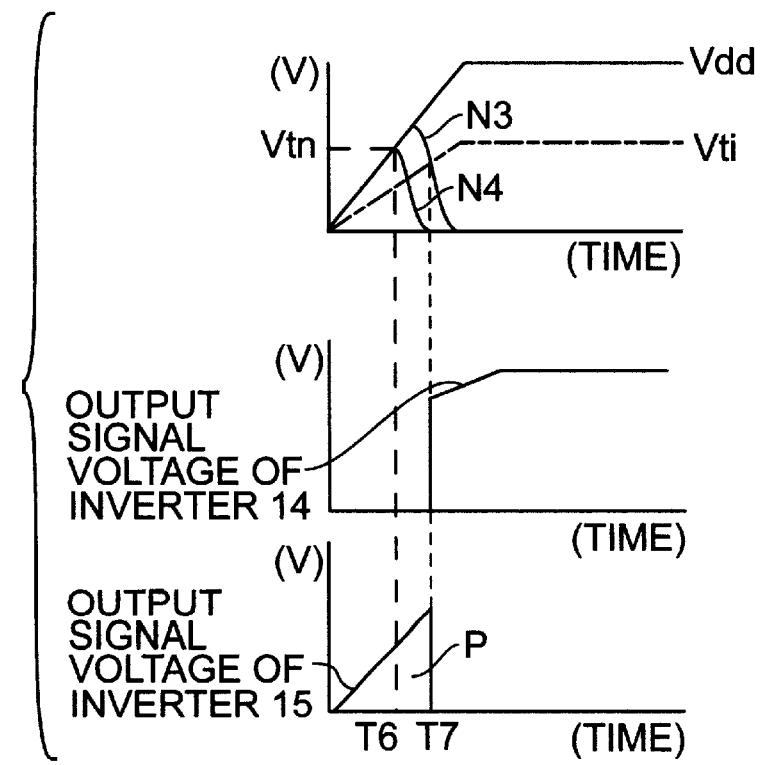

FIG. 6A shows waveforms for operating the power-on transistor 100 when the power supply voltage going up rapidly, and FIG. 6B shows waveforms for operating the power-on transistor 100 when the power supply voltage going up gradually. The first NMOS transistor 11 and the second NMOS transistors 12 are off at an initial status which means that power is not supplied. When the power is supplied to the circuit 100, the power supply voltage Vdd is applied to the power supply line 10. Then, the voltage applied to the gates of the first and second NMOS transistors 11, 12 goes up in accordance with the increase of the power supply voltage Vdd. Simultaneously, a threshold voltage Vti of the inverters 14, 15 also goes up in proportion to the increase of the power supply voltage Vdd. The voltages at the node N3 and the voltage at the node N4 also go up similar to the power supply voltage Vdd. While the power supply voltage Vdd goes up, the capacitor 16 is charged. Further, the first inverter 14 outputs a L level signal having ground level and the second inverter outputs an H level signal having the power supply voltage level Vdd.

Next, the operation of the power-on reset circuit 100 of the first embodiment will be explained in case where the power supply voltage Vdd goes up rapidly with reference to FIG. 6A.

At a time T4, the power supply voltage Vdd reaches to a threshold voltage Vtn of the NMOS transistors 11 and 12. At that time, the first and second NMOS transistors 11, 12 turn on. An electric current flows from the charged capacitor 16 to ground through the first NMOS transistor 11, so that the voltage level at the node N4 falls. However, since the electric current is mainly flows from the capacitor to ground, the voltage of the node N3 still goes up similar to the power supply voltage Vdd. Subsequently, the electric charge in the capacitor 16 runs out and the electric current flows from the power supply line 10 to ground through the resistor 13 and the first and second NMOS transistors 11 and 12. In other word, the capacitor 16 delays the drop of the voltage at the node N3.

At time T5, the voltage at the node N3 goes down to the threshold voltage Vti of the first inverter 14, the output signal of the first inverter 14 turns from the L level to the H level. Therefore, the output signal of the second inverter 15 turns from the H level to the L level. The second inverter 15 outputs a signal as a reset pulse signal P. Then, the reset pulse signal having a few nanoseconds pulse width is applied from the output of the second inverter 15 to an internal circuit of the semiconductor device.

Next, the operation of the power-on reset circuit 100 of the first embodiment will be explained in case where the power supply voltage Vdd goes up gradually with reference to FIG. 6B.

At a time T6, the power supply voltage Vdd reaches to a threshold voltage Vtn of the NMOS transistors 11 and 12. At that time, the first and second NMOS transistors 11, 12 turn on. An electric current flows from the charged capacitor 16 to ground through the first NMOS transistor 11, so that the voltage level at the node N4 falls. However, since the electric current is mainly flows from the capacitor to ground, the voltage of the node N3 still goes up similar to the power supply voltage Vdd. Subsequently, the electric charge in the capacitor 16 runs out and the electric current flows from the power supply line 10 to ground through the resistor 13 and the first and second NMOS transistors 11 and 12. In other word, the capacitor 16 delays the drop of the voltage at the node N3.

At time T7, the voltage at the node N3 goes down to the threshold voltage Vti of the first inverter 14, the output signal of the first inverter 14 turns from the L level to the H level which is still going up to similar to the power supply voltage Vdd. On the other hand, the output signal of the second inverter 15 turns from the H level to the L level. The second inverter 15 outputs a signal as a reset pulse signal P to an internal circuit of the semiconductor device. According to the first embodiment of the invention, the first and second NMOS transistors 11, 12 are connected in series between ground and the resistor 12 which is connected to the power supply line 10. Further, the capacitor 16 is connected between the power supply line 10 and the node N4 which is located between the NMOS transistors 11, 12. Therefore, the change of the voltage at the node N3 is delayed after the power supply voltage Vdd exceeds the threshold voltage Vtn of the first and second NMOS transistors 11 and 12. That is, a reset pulse signal is generated certainly, even if the power supply voltage Vdd goes up rapidly.

Furthermore, in the case that the power supply voltage Vdd goes up gradually, the voltage at the node N3 falls rapidly to the ground level. Therefore, the problem of repeated activation and deactivation of the inverters 14, 15 in the related art can be resolved. Further, the capacitor 16 works as a delay circuit for delaying the fall of the voltage at the node N3. Therefore, it is not necessary to add delay circuits between the NMOS transistors and the power supply, so that it is easy to design and manufacture a power-on reset circuit.

Figure 7:
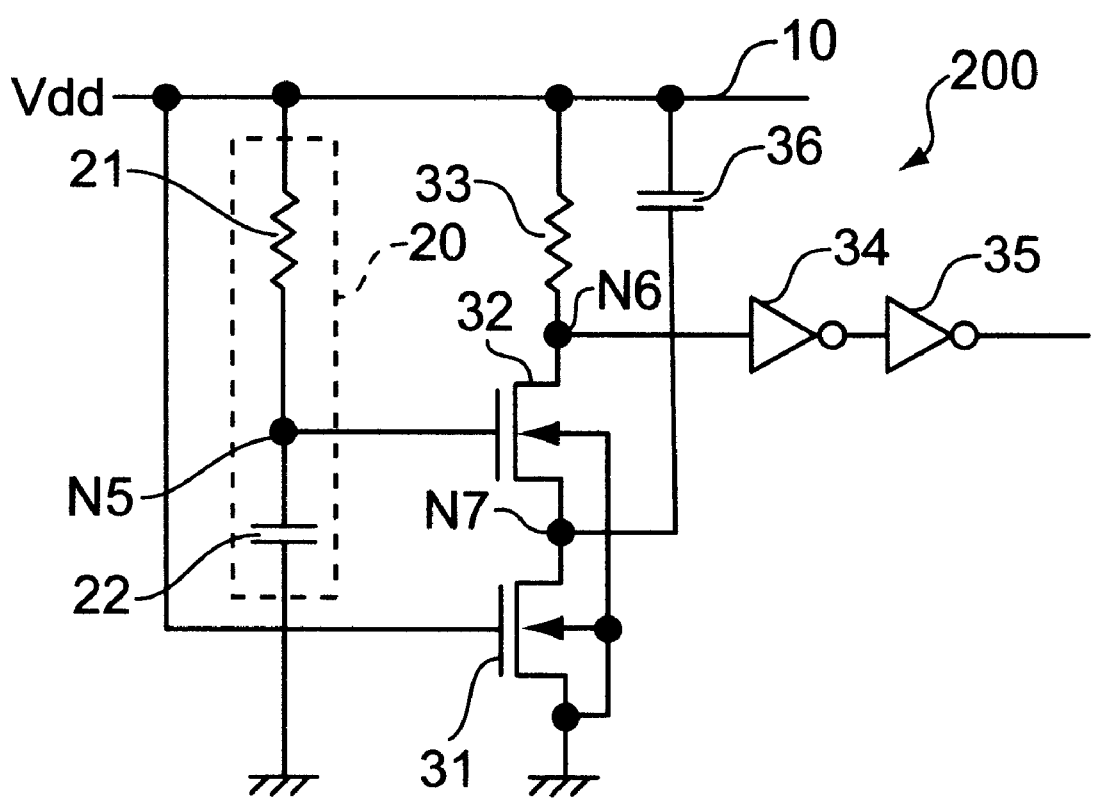
FIG. 7 is a circuit diagram of a power-on reset circuit of a second embodiment of the invention.
Figure 8A:
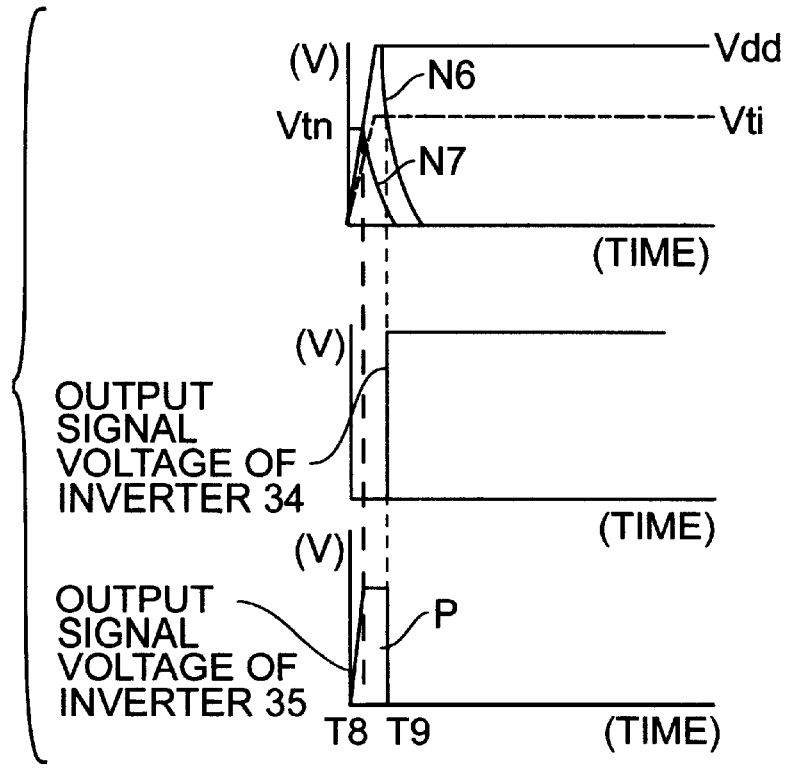
FIGS. 8A and 8B show waveforms for operating the power-on transistor shown in FIG. 7.
Figure 8B:
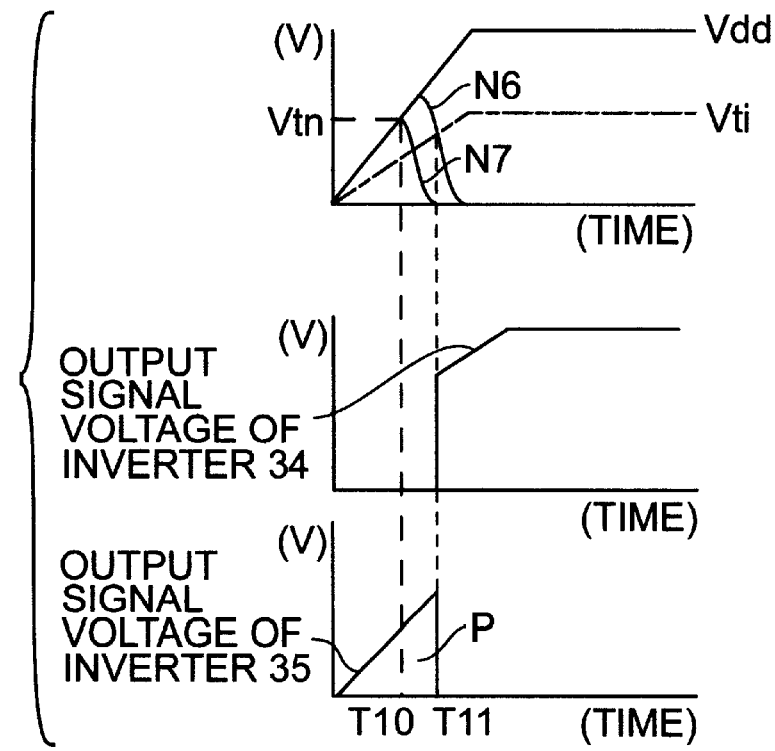

The second embodiment of the invention will be explained with reference to FIGS. 7, 8A and 8B. Referring to FIG. 7, a power-on reset circuit 200 of the second embodiment includes a delay circuit 20 in addition to the circuit 100 shown in FIG. 1. That is, the power-on reset circuit 200 includes the delay circuit 20, a first NMOS transistor 31, a second NMOS transistor 32, a first resistor 33, a first inverter 34, a second inverter 35 and a first capacitor 36. The delay circuit 20, which is connected between a power supply line 10 and ground, includes a second resistor 21 having 1 kΩ and a second capacitor 22 connected in series through a node N5. A silicon substrate or a well formed on the silicon substrate on which the first and second NMOS transistors 31 and 32 are formed (back gates of the NMOS transistors 31 and 32) is connected to ground. A source of the first NMOS transistor 31 is connected to ground. A drain of the first NMOS transistor 31 is connected to a source of the second NMOS transistor 32 through a node N7. A drain of the second NMOS transistor 32 is connected to one end of the first resistor 33 through a node N6. The other end of the first resistor 33 is connected to the power supply line 10. The resistance value of the first resistor 33 is set to 4 MΩ. An input terminal of the fist inverter 34 is connected to the node N6. The input terminal of the second inverter 35 is connected to an output terminal of the first inverter 34. The capacitor 36 is connected between the power supply line 10 and the node N7. A gate of the first NMOS transistor 31 is connected to the power supply line 10. A gate of the second NMOS transistor 32 is connected to the node N5. The second resistor 21 is connected between the power supply line 10 and the node N5. The second capacitor 22 is connected between the node N5 and ground.

Operation of the power-on reset circuit 200 is explained below with reference to FIGS. 8A and 8B.

The first and second NMOS transistors 31 and 32 are in off-status before the power supply voltage Vdd is applied to the line 10. By applying the power to the circuit 200, the power supply voltage Vdd applied to the line 10 goes up. The voltage applied to the gate of the first NMOS transistor 31 goes up because the gate of the first NMOS transistor 31 is directly connected to the line 10. The power supply voltage Vdd is applied to the gate of the second NMOS transistor 32 with a certain time delay from the application of the power supply voltage Vdd to the first NMOS transistor 31 because the gate of the second NMOS transistor 32 is connected to the line 10 through delay circuit 20. The threshold voltage Vti of the inverters 34 and 35 goes up in proportion to the increase of the power supply voltage Vdd. While the power supply voltage Vdd goes up, the capacitor 36 is charged. Further, the first inverter 31 outputs the L level signal having ground level, and the second inverter 32 outputs the H level signal having the power supply level Vdd.

The operation of the power-on reset circuit 200 of the second embodiment will be explained in case where the power supply voltage Vdd goes up rapidly with reference to FIG. 8A.

At a time T8, the power supply voltage Vdd reaches the threshold voltage Vtn of the first NMOS transistor 31, and the first NMOS transistor 31 is turned on.

An electric current flows from the charged capacitor 36 to ground through the first NMOS transistor 31, so that the voltage level at the node N7 falls. Since the second NMOS transistor 32 still be in the off state, the voltage of the node N6 goes up similar to the power supply voltage Vdd. After the certain time delay from the time T8, the second NMOS transistor 32 turns on. Then, the current flows from the power supply line 10 to ground through the first resistor 33, the node N6, the first NMOS transistor 31 and the second NMOS transistor 32. In other word, the delay circuit 20 delays the drop in the voltage at the node N6.

At a time T9, the voltage at the node N6 goes down to the threshold voltage Vti of the first inverter 34, the output signal of the first inverter 34 turns from the L level to the H level. Therefore, the output signal of the second inverter 35 turns from the H level to the L level. The second inverter 35 outputs a signal as a reset pulse signal P. Then the reset pulse signal P having a few nanoseconds pulse width is applied from the output of the second inverter 35 to an internal circuit of the semiconductor device.

Next, the operation of the power-on reset circuit 200 of the second embodiment will be explained in case where the power supply voltage Vdd goes up gradually with reference to FIG. 8B.

At a time T10, the power supply voltage Vdd reaches a threshold voltage Vtn of the first NMOS transistors 31. At that time, the first NMOS transistor 31 turns on. An electric current flows from the charged capacitor 36 to ground through the first NMOS transistor 31, so that the voltage level at the node N7 falls. Since the second NMOS transistor 32 still be in the off state, the voltage of the node N6 goes up similar to the power supply voltage Vdd. After the certain time delay from the time T10, the second NMOS transistor 32 turns on. Then, the current flows from the power supply line 10 to ground through the first resistor 33, the node N6, the first NMOS transistor 31 and the second NMOS transistor 32. In other word, the delay circuit 20 delays the drop in the voltage at the node N6.

At a time T11, the voltage at the node N6 goes down to the threshold voltage Vti of the first inverter 34, and the output signal of the first inverter 34 turns from the L level to the H level. Therefore, the output signal of the second inverter 35 turns from the H level to the L level. Since the resistance value of the first resistor 33 is higher than that of the second resistor 21, a drain current of the second NMOS transistor 32 is restricted. The power supply voltage Vdd is applied to the gate of the second NMOS transistor 32 with the certain delay determined by the delay circuit 20, a switching operation of the second NMOS transistor 32 is slow. That is, when the voltage at the node N6 turns to the L level once, it is hard to turn from the L level to the H level. Therefore, as the voltage at the node N6 is not rebounded easily, the output of the first inverter 34 turns to the H level from the L level certainly. The second inverter 35 outputs a signal as a reset pulse signal P. Then the reset pulse signal P having a few nanoseconds pulse width is applied from the output of the second inverter 35 to an internal circuit of the semiconductor device. According to the second embodiment of the invention, as the power supply voltage Vdd is applied to the gate of the second NMOS transistor 32 with the certain time delay determined by the delay circuit 20, the switching operation of the second NMOS transistor 32 is slow. Therefore, the power-on circuit 200 has a high reliability for a variation of the voltage of the power supply.

While the invention has been described with reference to illustrative embodiments, this description is not intended to be construed in a limiting sense. For example, the one end of the capacitor 16 or 36 may be connected to ground instead of the power supply line 10. By connecting the capacitor 16 or 36 to ground, the current flowing through the first NMOS transistor 11 or 31 can be delayed.

Figure 9:
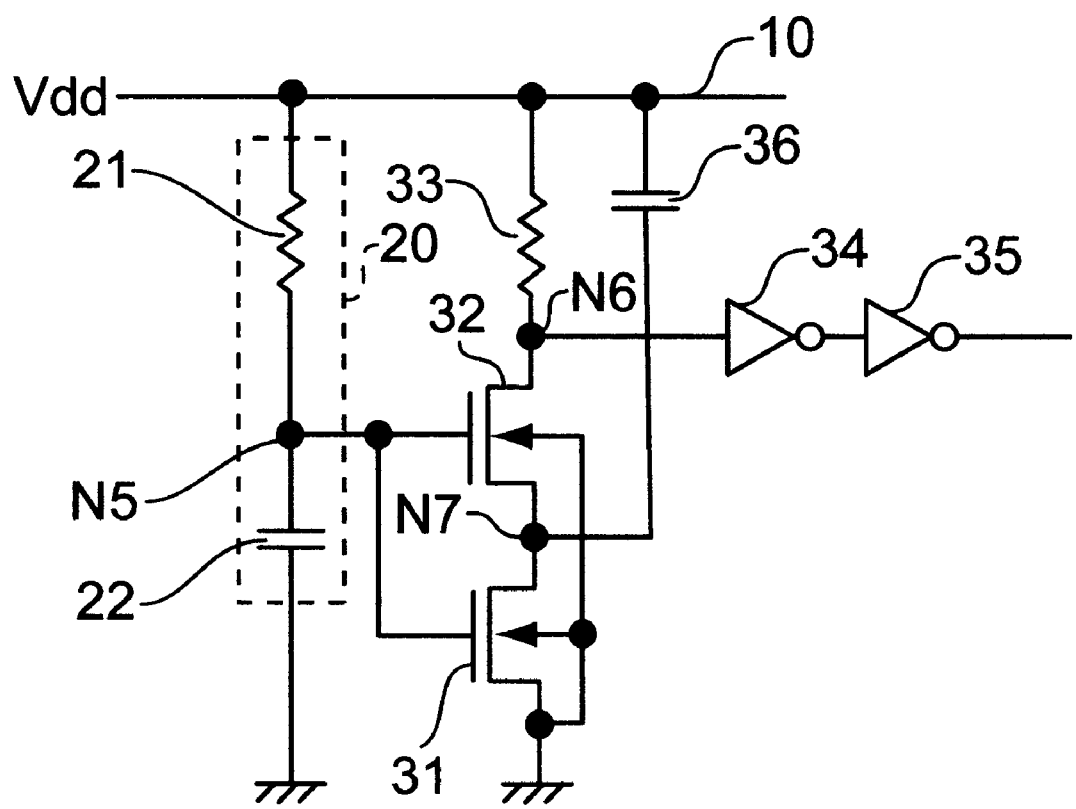
FIG. 9 is a circuit diagram of a power-on reset circuit of the modified second embodiment of the invention.

In the power-on reset circuit 200, the output of the delay circuit 20 may be connected to the gate of the first NMOS transistor 31 instead of the gate of the second NMOS transistor 32 as shown in FIG. 9. Further, the output of the delay circuit may be connected to both of the gates of the first and second NMOS transistor 31 and 32. As to the capacitor 36, it may be omitted from the power-on reset circuit 200. The NMOS transistors should be replaced to PMOS transistor when the power supply voltage is lower than ground voltage.

Various modifications of the illustrated embodiments, as well as other embodiments of the invention, will be apparent to those skilled in the art on reference to this description. Therefore, the appended claims are intended cover any such modifications or embodiments as fall within the true scope of the invention.

What I claim is:

1. A power-on reset circuit generating a reset pulse signal when a power supply voltage rises up, the power-on reset circuit comprising:

a power supply line for receiving a first power supply potential;

a first node;

a first resistive element connected between said power supply line and said first node;

a second node;

a reference node for receiving a second power supply potential;

a first transistor having a gate connected to the power supply line, a drain connected to the second node, and a source connected to the reference node;

a delay circuit having an input terminal connected to said power supply line and an output terminal;

a capacitor connected between the power supply line and the second node;

a second transistor having a gate connected to the output terminal of said delay circuit, a drain connected to the first node, and the source connected to the second node; and a first inverter having an input terminal connected to the first node.

2. A power-on reset circuit as claimed in claim 1, wherein each of said first and second transistor has a back gate connected to the reference node.

3. A power-on reset circuit as claimed in claim 1, further comprising a second inverter having an input terminal connected to an output terminal of the first inverter, the first and second inverters being operated by the power supply voltage.

4. A power-on reset circuit as claimed in claim 1, further comprising a capacitor having a first terminal connected to said second node and a second terminal connected to said reference node.

5. A power-on reset circuit as claimed in claim 1, wherein a voltage of the first power supply potential is higher than that of the second power supply potential, and said first and second transistors are NMOS transistors.

6. A power-on reset circuit as claimed in claim 1, wherein said delay circuit including a second resistive element connected between the power supply line and the gate of said second transistor; and a capacitor connected between the reference node and the gate of said second transistor.

7. A power-on reset circuit generating a reset pulse signal when a power supply voltage rises up, the power-on reset circuit comprising:

a power supply line for receiving a first power supply potential;

a first node;

a first resistive element connected between said power supply line and said first node;

a second node;

a reference node for receiving a second power supply potential;

a delay circuit having an input terminal connected to said power supply line and an output terminal;

a capacitor connected between the power supply line and the second node;

a first transistor having a gate connected to the output terminal of said delay circuit, a drain connected to the second node, and a source connected to the reference node;

a second transistor having a gate connected to the output terminal of said delay circuit, a drain connected to the first node, and the source connected to the second node; and a first inverter having an input terminal connected to the first node.

8. A power-on reset circuit as claimed in claim 7, wherein each of said first and second transistor has a back gate connected to the reference node.

9. A power-on reset circuit as claimed in claim 7, further comprising a second inverter having an input terminal connected to an output terminal of the first inverter, the first and second inverters being operated by the power supply voltage.

10. A power-on reset circuit as claimed in claim 7, further comprising a capacitor having a first terminal connected to said second node and a second terminal connected to said reference node.

11. A power-on reset circuit as claimed in claim 7, wherein a voltage of the first power supply potential is higher than that of the second power supply potential, and said first and second transistors are NMOS transistors.

12. A power-on reset circuit as claimed in claim 7, wherein said delay circuit including a second resistive element connected between the power supply line and the gate of said second transistor; and a capacitor connected between the reference node and the gate of said second transistor.

* * * * *